(12) United States Patent
Shim et al.

(10) Patent No.: US 8,237,878 B2
(45) Date of Patent: Aug. 7, 2012

(54) LIQUID CRYSTAL DISPLAY

(75) Inventors: Seung-Hwan Shim, Seongnam-si (KR); Kap-Soo Yoon, Seoul (KR); Sung-Hoon Yang, Seoul (KR); Ki-Hun Jeong, Cheonan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 556 days.

(21) Appl. No.: 12/536,693

(22) Filed: Aug. 6, 2009

(65) Prior Publication Data

US 2010/0053486 A1 Mar. 4, 2010

(30) Foreign Application Priority Data

Sep. 2, 2008 (KR) ........................ 10-2008-0086329

(51) Int. Cl.
*G02F 1/1343* (2006.01)
(52) U.S. Cl. .............. 349/39; 349/38; 349/139; 359/54; 359/58; 359/59; 359/79
(58) Field of Classification Search .................... 349/39, 349/46, 47; 359/54, 58, 59, 79
See application file for complete search history.

(56) References Cited

U.S. PATENT DOCUMENTS

| 5,151,806 | A | * | 9/1992 | Kawamoto et al. | ............. | 349/39 |
| 5,982,462 | A | * | 11/1999 | Nakano et al. | ................... | 349/43 |
| 7,573,539 | B2 | * | 8/2009 | Her et al. | ......................... | 349/43 |
| 7,804,091 | B2 | * | 9/2010 | Takechi et al. | .................. | 257/59 |

FOREIGN PATENT DOCUMENTS

| JP | 2007-157916 | 6/2007 |
| JP | 2008-040343 | 2/2008 |
| KR | 1020030022692 | 3/2003 |

* cited by examiner

*Primary Examiner* — Edward Glick
*Assistant Examiner* — Sang Nguyen
(74) *Attorney, Agent, or Firm* — F. Chau & Associates, LLC

(57) ABSTRACT

A liquid crystal display (LCD) includes a gate wiring, a first insulating substrate, an oxide active layer pattern, a data wiring, a floating electrode, and an upper gate electrode. The gate wiring includes a gate line formed on the first insulating substrate and a lower gate electrode extending from the gate line. The oxide active layer pattern is formed on the gate wiring. The data wiring includes a data line intersecting the gate line. The floating electrode generates a coupling capacitance by overlapping the gate wiring. The upper gate electrode is capacitively coupled to the lower gate electrode.

17 Claims, 8 Drawing Sheets

LIQUID CRYSTAL DISPLAY

CROSS-REFERENCE TO RELATED APPLICATION

This application claims priority to Korean Patent Application No. 10-2008-0086329, filed on Sep. 2, 2008 in the Korean Intellectual Property Office, the disclosure of which is incorporated by reference in its entirety herein.

BACKGROUND OF THE INVENTION

1. Technical Field

Embodiments of the present invention relate to a liquid crystal display (LCD), and more particularly, to an LCD capable of applying a voltage having an adjusted level and polarity to an upper gate electrode without the need of additional wiring.

2. Discussion of Related Art

Liquid crystal displays (LCDs) are one of the most widely-used flat panel displays (FPDs). An LCD may include two substrates having a plurality of electrodes formed thereon and a liquid crystal layer interposed between the two substrates. The amount of light transmitted through the liquid crystal layer may be adjusted by applying a voltage to the electrodes to rearrange liquid crystal molecules in the liquid crystal layer.

There is a growing demand for LCDs having improved current and light durability. Oxide thin-film transistor (TFT) display panels having active layer patterns formed of a semiconductor oxide have excellent mobility, light insensitivity and low-temperature deposition properties.

SUMMARY OF THE INVENTION

However, oxide TFT display panels are not resilient against a negative bias voltage, which may cause a defect such as a discoloration in the display due to a threshold voltage shift phenomenon. This weakness has been addressed by a method that adds an upper gate electrode to the LCD and applies an independent voltage to the upper gate electrode. This method, however, requires the installation of additional wiring and the application of an additional voltage, and thus may not be suitable for use in the fabrication of an LCD.

Thus, there is a need for an LCD that is capable of applying a voltage having an adjusted level and polarity to an upper gate electrode without the need of additional wiring.

According to an exemplary embodiment of the present invention, an LCD includes a gate wiring, a first insulating substrate, an oxide active layer pattern, a data wiring, a floating electrode, and an upper gate electrode. The gate wiring includes a gate line formed on the first insulating substrate and a lower gate electrode extending from the gate line. The oxide active layer pattern is formed on the gate wiring. The data wiring includes a data line intersecting the gate line. The floating electrode generates a coupling capacitance by overlapping the gate wiring. The upper gate electrode is capacitively coupled to the lower gate electrode. The gate line may extend in a first direction (e.g., a row direction) and the data wiring may extend in a second direction (e.g., a column direction).

According to an exemplary embodiment of the present invention, an LCD includes a gate wiring, a first insulating substrate, a storage wiring, an oxide active layer pattern, a data wiring, a floating electrode, and an upper gate electrode. The gate wiring includes a gate line formed on the first insulating substrate and a lower gate electrode extending from the gate line. The storage wiring includes a storage line extending substantially in parallel with the gate line. The oxide active layer pattern is formed on the gate wiring. The data wiring includes a data line intersecting the gate line. The floating electrode generates a coupling capacitance by overlapping the gate wiring. The floating electrode generates a storage capacitance by overlapping the storage line. The upper gate electrode is capacitively coupled to the lower gate electrode. The gate line may extend in a first direction (e.g., a row direction) and the data wiring may extend in a second direction (e.g., a column direction).

BRIEF DESCRIPTION OF THE DRAWINGS

The present invention will become more apparent by describing in detail exemplary embodiments thereof with reference to the attached drawings, in which.

DETAILED DESCRIPTION OF EXEMPLARY EMBODIMENTS

The present invention will now be described more fully with reference to the accompanying drawings, in which exemplary embodiments of the invention are shown. The invention may, however, be embodied in many different forms and should not be construed as being limited to the embodiments set forth herein.

Figure 1:
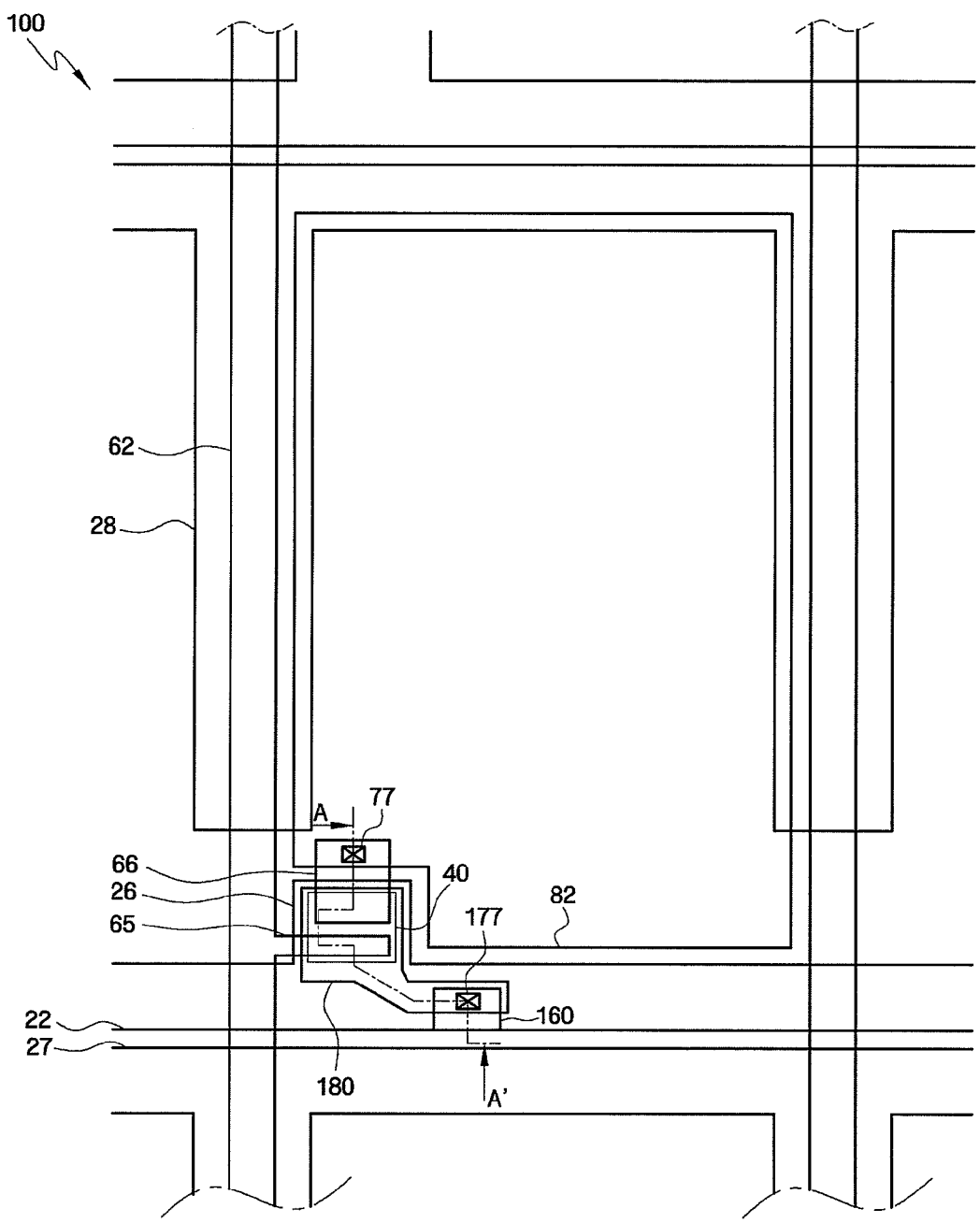
FIG. 1 illustrates a layout of a thin-film transistor (TFT) display panel included in a liquid crystal display (LCD) according to an exemplary embodiment of the present invention.

A liquid crystal display (LCD) according to an exemplary embodiment of the present invention will hereinafter be described in detail with reference to FIGS. 1 through 3. FIG. 1 illustrates a layout of a thin-film transistor (TFT) display panel 100 included in an LCD according to an exemplary embodiment of the present invention, FIG. 2 illustrates a cross-sectional view of the LCD of the exemplary embodiment of FIG. 1, taken along line A-A' of FIG. 1, and FIG. 3 illustrates a cross-sectional view of a variation of the LCD of the exemplary embodiment of FIG. 1, taken along line A-A' of FIG. 1.

Figure 2:
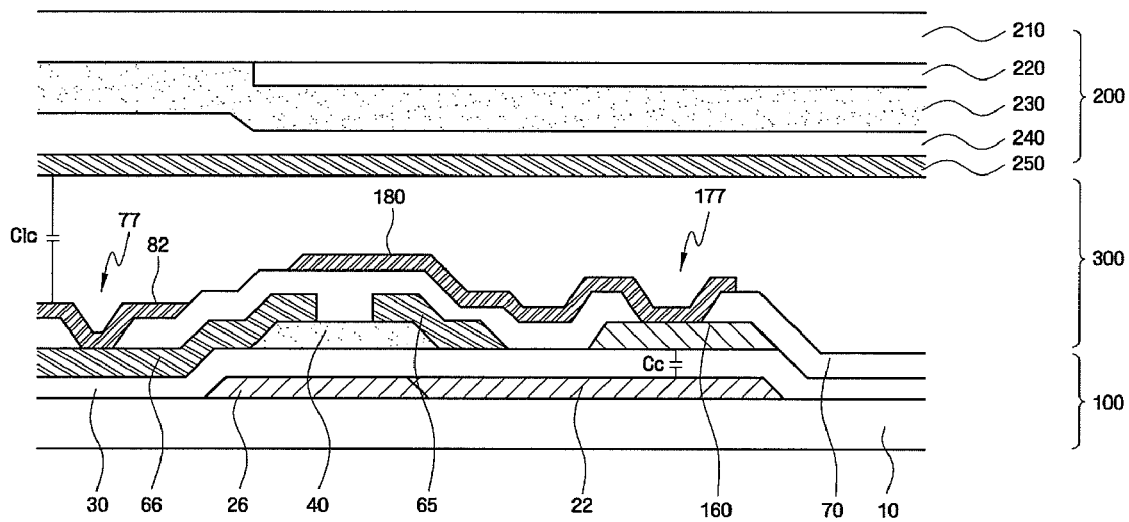
FIG. 2 illustrates a cross-sectional view of the LCD of the exemplary embodiment of FIG. 1, taken along line A-A' of FIG. 1.
Figure 3:
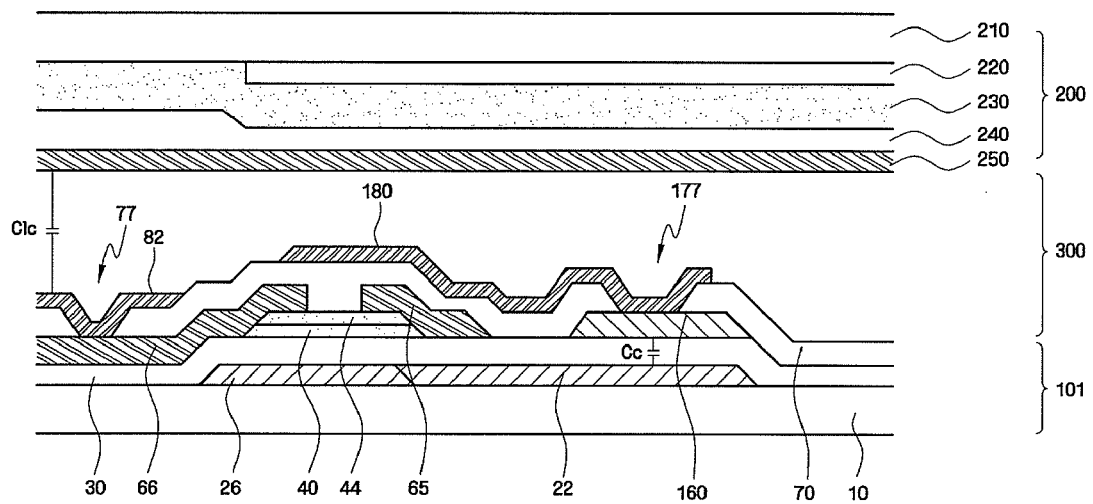
FIG. 3 illustrates a cross-sectional view of a variation of the LCD of the exemplary embodiment of FIG. 1, taken along line A-A' of FIG. 1.

Referring to FIGS. 1 and 2, an LCD according to an exemplary embodiment of the present invention may include the TFT display panel 100 and a common electrode display panel 200, which face each other, and a liquid crystal layer 300, which is interposed between the TFT display panel 100 and the common electrode panel 200.

The TFT display panel 100 may include a first insulating substrate 10, which may be formed of glass such as soda lime glass or borosilicate glass or a plastic material, and various devices such as TFTs, which are formed on the first insulating substrate 10.

A gate wiring (22 and 26) may be formed on the first insulating substrate 10 and may transmit a gate signal. The gate wiring (22 and 26) may include a gate line 22 extending in one direction (e.g., a row direction) and a lower gate electrode 26 extending from the gate line 22 as a protrusion. The lower gate electrode 26 may turn on or off a channel below an oxide active layer pattern 40. The lower gate electrode 26 may be capacitively coupled to an upper gate electrode 180.

A storage wiring (27 and 28) may be formed on the first insulating substrate 10 and may transmit a common voltage. The storage wiring (27 and 28) may include a storage line 27 and a storage line branch 28. The storage line 27 may extend in the row direction substantially in parallel with the gate line 22. The storage line branch 28 may be branched off from the storage line 27. The storage line branch 28 may overlap a data line 62 and may thus prevent light leakage.

The gate wiring (22 and 26) and the storage wiring (27 and 28) may be formed of an aluminum (Al)-based metal such as aluminum and an aluminum alloy, a silver (Ag)-based metal such as silver and a silver alloy, a copper (Cu)-based metal such as copper and a copper alloy, a molybdenum (Mo)-based metal such as molybdenum and a molybdenum alloy, chromium (Cr), titanium (Ti) or tantalum (Ta). The gate wiring (22 and 26) and the storage wiring (27 and 28) may have a multilayer structure including two conductive layers (not shown) having different physical properties. The two conductive layers may include a first conductive layer formed of a low-resistive metal and a second conductive layer formed of a material having excellent contact properties with respect to, for example, zinc oxide (ZnO), indium tin oxide (ITO) or indium zinc oxide (IZO). The first conductive layer may be formed of a material such as an aluminum-based metal, a silver-based metal or a copper-based metal to reduce signal delays or voltage drops, and the second conductive layer may be formed of a material such as a molybdenum-based metal, chromium, titanium or tantalum. For example, the gate wiring (22 and 26) and the storage wiring (27 and 28) may have a double-layer structure including a chromium lower layer and an aluminum upper layer or a double-layer structure including an aluminum lower layer and a molybdenum upper layer. However, embodiments of the present invention are not restricted to the above described materials. For example, the gate wiring (22 and 26) and the storage wiring (27 and 28) may be formed of various metals or various conductive materials other than those set forth herein.

The gate wiring (22 and 26) and the storage wiring (27 and 28) may be formed using, for example, sputtering. Sputtering is a method of depositing thin films by ejecting material from a source that deposits the material onto a substrate. Wet etching or dry etching may be used to pattern the gate wiring (22 and 26) and the storage wiring (27 and 28). For example, the gate wiring (22 and 26) and the storage wiring (27 and 28) may be patterned using wet etching and using an etchant such as phosphoric acid, nitric acid or acetic acid. Alternatively, the gate wiring (22 and 26) and the storage wiring (27 and 28) may be patterned using dry etching and using a chlorine-based etching gas, for example, $Cl_2$ or $BCl_3$.

A gate insulating layer 30 may be formed of, for example, silicon oxide (SiOx) or silicon nitride (SiNx). The gate insulating layer 30 may be formed on the first insulating substrate 10, the gate wiring (22 and 26) and the storage wiring (27 and 28). The gate insulating layer 30 may be formed, for example, using plasma-enhanced chemical vapor deposition (PECVD) or reactive sputtering. PECVD is a process used to deposit thin films from a gas state to a solid state on a substrate.

The oxide active layer pattern 40 may be formed on the gate insulating layer 30 using an oxide such as Zn, In, Ga, Sn or a combination thereof. The oxide active layer pattern 40 may be formed of an active material that may have electrical properties when a driving current is applied thereto. Examples of the active material may include a semiconductor and a metal oxide. For example, the oxide active layer pattern 40 may be formed of a mixed oxide such as ZnO, InZnO, InGaO, InSnO, ZnSnO, GaSnO, GaZnO, GaZnSnO or GaInZnO. The oxide active layer pattern 40 may have excellent semiconductor properties. For example, the effective mobility of the oxide active layer pattern 40 may range between about 2 to about 100 times higher than the effective mobility of hydrogenated amorphous silicon, and the oxide active layer pattern 40 may have an on-off current ratio ranging between about $10^5$ to about $10^8$. In addition, the oxide active layer pattern 40 may have a band gap ranging from about 3.0 to about 3.5 eV, which may prevent the generation of a leakage optical current. An oxide active layer pattern 40 with at least some of the above described properties may prevent the generation of afterimages. Moreover, the oxide active layer pattern 40 does not require a light shield layer to be formed below an oxide TFT, and may thus improve the aperture ratio of an LCD. In order to improve the semiconductor properties of the oxide active layer pattern 40, the active layer pattern 40 may additionally include an element of Group 3, 4 or 5 of the periodic table or a transition element. Moreover, since the oxide active layer pattern 40 has a high effective mobility regardless of its amorphous state, the oxide active layer pattern 40 may be directly applied to the fabrication of typical amorphous silicon and may thus be used to fabricate a large-scale display device.

The oxide active layer pattern 40 may have a single-layer structure. In a variation of the exemplary embodiment of FIG. 2, the oxide active layer pattern 40 may have a hybrid-layer structure. For example, referring to FIG. 3, an oxide active layer pattern (40 and 44) may have a hybrid-layer structure including a stack of a mixed oxides such as ZnO, InZnO, InGaO, InSnO, ZnSnO, GaSnO, GaZnO, GaZnSnO or GaInZnO and micro-crystal silicon. The TFT display panel 100 including the active layer pattern 40 having a single-layer structure may provide excellent negative bias stability in response to a negative bias applied to the upper gate electrode 180. Further, a TFT display panel 101 including the oxide active layer pattern (40 and 44) having a hybrid-layer structure may provide excellent negative bias stability in response to a positive bias applied to the upper gate electrode 180. If a TFT is driven for a long time, the threshold voltage of a TFT may decrease due to an off voltage being applied for longer than an on voltage to an LCD. Accordingly, a leakage current may be generated and a defect such as discoloration may occur. This phenomenon is referred to as negative bias stability.

A data wiring (62, 65 and 66) may be formed on the oxide active layer pattern 40 and the gate insulating layer 30. The data wiring (62, 65 and 66) may include a data line 62 extending in, for example, a column direction and intersecting the gate line 22 to define a pixel, a source electrode 65 branched off from the data line 62 and extending over the oxide active layer pattern 40, and a drain electrode 66 isolated from the source electrode 65 and formed on the oxide active layer pattern 40. The source electrode 65 and the drain electrode 66 may be disposed on opposite sides of the lower gate electrode 26 or a channel portion of an oxide TFT.

A floating electrode 160 may overlap the gate wiring (22 and 26), thereby generating a coupling capacitance Cc. For example, the floating electrode 160 may overlap the gate line 22. The coupling capacitance Cc may be determined by the overlapping area of the floating electrode 160 and the gate line 22.

The floating electrode 160 may be disposed on a same level with, for example, the data line 62. In addition, the floating electrode 160 may be formed of the same material as that of the data line 62. Thus, the floating electrode 160 and the data wiring (62, 65 and 66) may be formed through the same processes, thereby preventing dramatic increases in the time and cost required to form the TFT display panel 100.

The data wiring (62, 65 and 66) and the floating electrode 160 may be formed of, for example, aluminum, copper, silver, molybdenum, chromium, titanium, tantalum, nickel (Ni), cobalt or an alloy thereof. For example, the data wiring (62, 65 and 66) and the floating electrode 160 may be formed of a low-resistive metal material such as an aluminum-based metal such as aluminum or an aluminum alloy, a silver-based metal such as silver or a silver alloy, or a copper-based metal such as copper or a copper alloy.

The source electrode 65 may at least partially overlap the oxide active layer pattern 40. The source electrode 65 and the drain electrode 66 may be disposed on opposite sides of a channel portion of an oxide TFT. The drain electrode 66 may at least partially overlap the oxide active layer pattern 40.

A passivation layer 70 may be formed on the data wiring (62, 65 and 66). The passivation layer 70 may be formed of an inorganic material such as silicon nitride or silicon oxide, an organic material having excellent planarization and photosensitivity properties, or a low-k dielectric material obtained by PECVD such as a-Si:C:O or a-Si:O:F. The passivation layer 70 may have a double-layer structure including an organic layer and an organic layer.

A contact hole 77 may be formed through the passivation layer 70 so that the drain electrode 66 can be exposed through the contact hole 77. A pixel electrode 82 may be formed on the passivation layer 70, and may be electrically connected to the drain electrode 66 through the contact hole 77. A contact hole 177 may also be formed through the passivation layer 70 so that the floating electrode 160 can be electrically connected to the upper gate electrode 180 through the contact hole 177.

The pixel electrode 82 may be formed of a transparent conductive material such as ITO or IZO or a reflective conductive material such as aluminum. The pixel electrode 82 may generate an electric field along with a common electrode 250 when a data voltage is applied thereto. Due to the electric field, liquid crystal molecules in the liquid crystal layer 300 between the TFT display panel 100 and a common electrode display panel 200 may rotate.

The upper gate electrode 180 may at least partially overlap the source electrode 65, the drain electrode 66 and the oxide active layer pattern 40. The upper gate electrode 180 may be capacitively coupled to the lower gate electrode 26. Thus, when a voltage is applied to the lower gate electrode 26, an induced voltage may be applied to the upper gate electrode 180. The induced voltage applied to the upper gate electrode 180 may be different from the voltage applied to the lower gate electrode 26. The upper gate electrode 180 may turn on or off a channel above the oxide active layer pattern 40.

The upper gate electrode 180 may be formed of the same material as that of the pixel electrode 82. In addition, the upper gate electrode 180 may be disposed on a same level with the pixel electrode 82. Thus, the upper gate electrode 180 and the pixel electrode 82 may be formed through the same processes. Therefore, an increase in the time taken to form the TFT display panel 100 that may have been caused if the upper gate electrode 180 and the pixel electrode 82 are formed separately may be prevented.

In the exemplary embodiment of FIG. 1, the upper gate electrode 180 is connected to the floating electrode 160 through the contact hole 177. Thus, a voltage applied to the upper gate electrode 180 may be an induced voltage applied to the floating electrode 160 due to the coupling capacitance Cc.

An induced voltage Vtgate1 applied to the upper gate electrode 180 due to the coupling capacitance Cc may be represented by Equation (1) as follows:

$$Vtgate1 = Vbgate * (Cc)/(Cc + Clc) \quad (1)$$

where Vbgate indicates a voltage applied to the lower gate electrode 26, and Clc indicates a liquid crystal capacitance.

Table 1 shows induced voltage measurements obtained from the upper gate electrode 180 by using Equation (1) while varying the overlapping area of the floating electrode 160 and the gate line 22.

TABLE 1

| Vbgate | Vtgate1 | | | |
|--------|---------|--------|--------|--------|
| 20 V   | 2.5 V   | 4.4 V  | 7.2 V  | 10.6 V |
| 25 V   | 3.1 V   | 5.5 V  | 9 V    | 13.2 V |

For example, Table 1 shows induced voltage measurements obtained from the upper gate electrode 180 by applying a voltage of 20 V or 25 V to the lower gate electrode 26 and sequentially varying the coupling capacitance Cc from 0.05 F to 0.1 F, from 0.1 F to 0.2 F, and from 0.2 F to 0.4 F when the liquid crystal capacitance Clc is 0.35 F. Referring to Table 1, when a voltage applied to the lower gate electrode 26, i.e., the voltage Vbgate, is 20 V and the coupling capacitance Cc is 0.4 F, an induced voltage applied to the upper gate electrode 180, i.e., the voltage Vtgate1, is 10.6 V. The voltage Vtgate1 may be adjusted by adjusting the overlapping area of the floating electrode 160 and the gate line 22. As described above, it is possible to apply different voltages to the upper gate electrode 180 and the lower gate electrode 26 and thus to realize an LCD capable of reducing the probability of the occurrence of a threshold voltage shift phenomenon and providing excellent negative bias stability properties. In addition, since there is no need to form additional wiring for the upper gate electrode 180, the fabrication of an LCD may be simplified.

Referring to FIG. 2, a black matrix 220 may be formed on a second insulating substrate 210 and may define a pixel region. The black matrix 220 may be formed of an opaque material such as chromium. The black matrix 220 may prevent light leakage and may thus improve the picture quality of an LCD. The black matrix 220 may overlap the gate wiring (22 and 26) and/or the data wiring (62, 65 and 66) of the TFT display panel 100 and may be used to maximize the aperture ratio of an LCD.

The pixel region defined by the black matrix 220 may include a plurality of pixels. The pixels may be arranged in various manners. For example, the pixels may be arranged to form stripes, a mosaic pattern, or a delta pattern. If the pixels are arranged in stripes, each stripe of pixels may be referred to as a pixel column.

A color filter pattern 230 may be formed in the pixel region defined by the black matrix 220. The color filter pattern 230 may include a plurality of materials that pass light of different color, i.e., light having different wavelength bands. The color filter pattern 230 may be formed in the pixel region and may at least partially overlap the black matrix 220. Portions of the color filter pattern 230 on the black matrix 220 and portions of the color filer pattern 230 on the common electrode substrate 200 may have a step difference.

For example, the color filter pattern 230 may include a red organic material passing light having a red wavelength therethrough, a green organic material passing light having a green wavelength therethrough, and a blue organic material passing light having a blue wavelength therethrough. For example, an n-th (where n is a natural number) pixel column in the pixel region defined by the black matrix 220 may include a red color filter pattern, an (n+1)-th pixel column may include a green color filter pattern, and an (n+2)-th pixel column may include a blue color filter pattern.

The color filter pattern 230 may be formed of a photosensitive organic material such as a photoresist. For example, the color filter pattern 230 may be formed of a negative photoresist or a positive photoresist. A negative photoresist is a type of photoresist in which portions exposed to light become hardened, and a positive photoresist is a type of photoresist in which portions exposed to light become softened.

The color filter pattern 230 may be formed to have a uniform thickness across the common electrode display panel 200. Alternatively, the color filter pattern 230 may be formed to have a step difference in consideration of the relationship between cell gap and the wavelength of color light. An overcoat layer 240 may be formed on the black matrix 220 and the color filter pattern 230, and may reduce a step difference generated by the underlying layers.

A common electrode 260 may be formed on the overcoat layer 240. The common electrode 250 may adjust the alignment of liquid crystal molecules in the liquid crystal layer 300 and may thus display a color image by generating a potential difference with the pixel electrode 82 of the TFT display panel 100. The common electrode 250 may be formed of a transparent conductive material such as ITO or IZO to enable light to pass through and thus to display a color image.

The capacitance generated by the common electrode 250 and the pixel electrode 82 is the liquid crystal capacitance Clc. The liquid crystal capacitance Clc may affect an induced voltage applied to the upper gate electrode 180, as described above with reference to Equation (1).

The ratio of the liquid crystal capacitance Clc and the coupling capacitance Cc may be within the range of about 0.1 to about 10 to minimize the shift of an initial source/drain current with respect to a gate voltage. An optimum induced voltage may be applied to the upper gate electrode 180 in response to a voltage applied to the lower gate electrode 26 when the ratio is in the above described range, thereby improving the negative bias stability of an LCD.

In the exemplary embodiment of FIG. 1, the black matrix 220, the color filter pattern 230 and the common electrode 250 may all be formed on an upper substrate. However, embodiments of the present invention are not restricted thereto. For example, the exemplary embodiment of FIG. 1 can be applied to a black matrix-on-array (BOA) structure in which the black matrix 220 is formed on the TFT display panel 100 or to a color filter-on-array (COA) structure in which the color filter pattern 230 is formed on the TFT display panel 100. LCDs according to other exemplary embodiments of the present invention can also be applied to the BOA structure and the COA structure.

Figure 4:
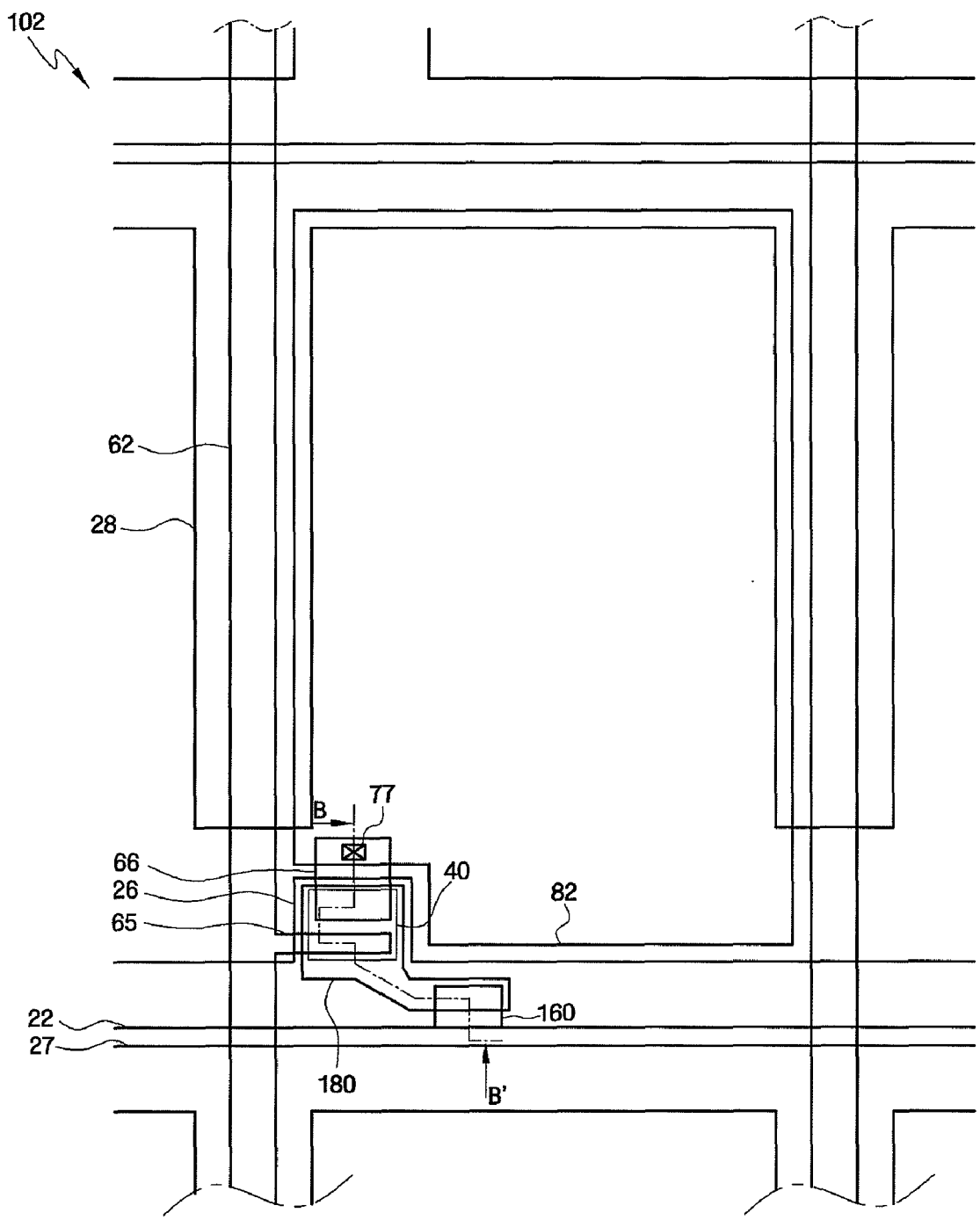
FIG. 4 illustrates a layout of a TFT display panel included in an LCD according to an exemplary embodiment of the present invention.
Figure 5:
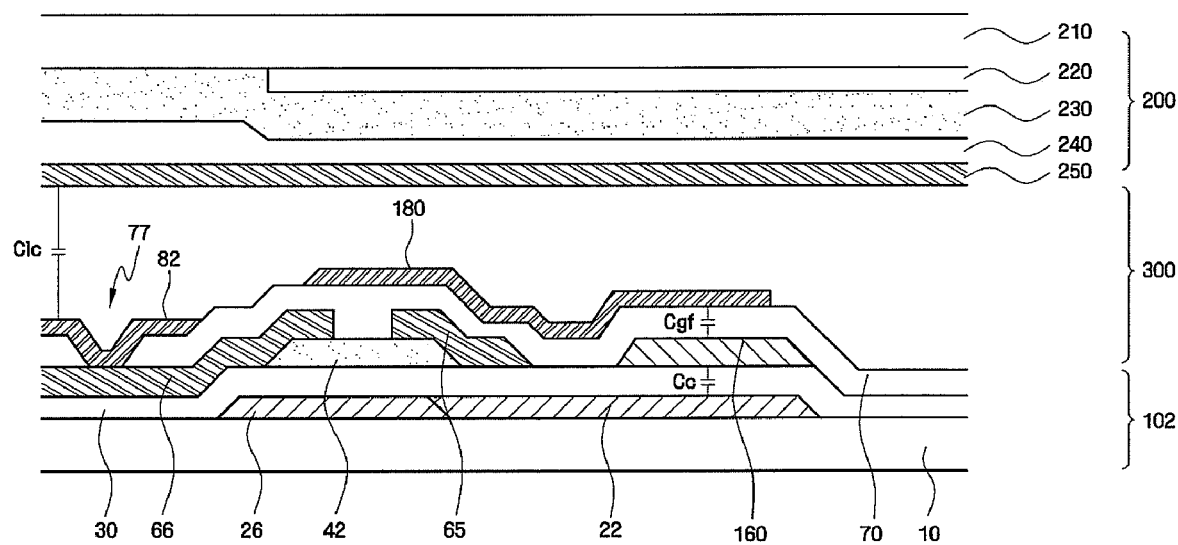
FIG. 5 illustrates a cross-sectional view of the LCD of the exemplary embodiment of FIG. 4, taken along line B-B' of FIG. 4.

An LCD according to an exemplary embodiment of the present invention will hereinafter be described in detail with reference to FIGS. 4 and 5. FIG. 4 illustrates a layout of a TFT display panel 102 included in an LCD according to an exemplary embodiment of the present invention, and FIG. 5 illustrates a cross-sectional view of the LCD of the exemplary embodiment of FIG. 4, taken along line B-B' of FIG. 4. In FIGS. 1 through 5, like reference numerals indicate like elements, and thus, detailed descriptions thereof will be omitted.

Referring to FIGS. 4 and 5, a passivation layer 70, which is formed on the TFT display panel 102, does not include any contact hole for connecting an upper gate electrode 180 and a floating electrode 160. For example, the upper gate electrode 180 may be isolated from the floating electrode 160, and the passivation layer 170 may be interposed between the upper gate electrode 180 and the floating electrode 160. Therefore, an upper gate coupling capacitance Cgf may be generated between the upper gate electrode 180 and the floating electrode 160.

When a voltage is applied to a lower gate electrode 26, an induced voltage may be applied to the upper gate electrode 180 due to a coupling capacitance and the upper gate coupling capacitance Cgf. For example, in the exemplary embodiment of FIG. 4, the coupling capacitance Cc and the upper gate coupling capacitance Cgf may both be used to apply different voltages to the lower gate electrode 26 and the upper gate electrode 180.

Figure 6:
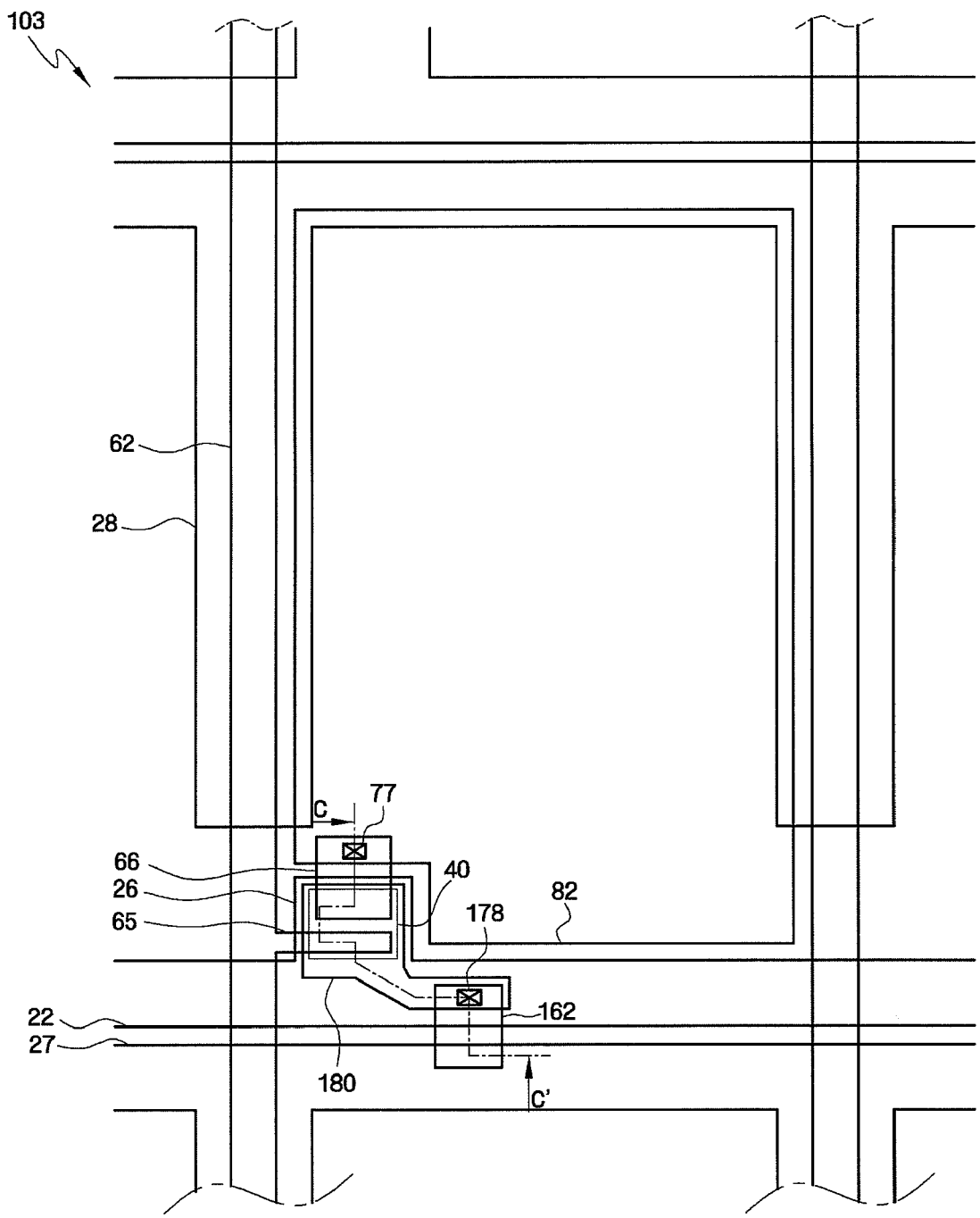
FIG. 6 illustrates a layout of a TFT display panel included in an LCD according to an exemplary embodiment of the present invention.

An LCD according to an exemplary embodiment of the present invention will hereinafter be described in detail with reference to FIGS. 6 and 7. FIG. 6 illustrates a layout of a TFT display panel 103 included in an LCD according to another exemplary embodiment of the present invention, and FIG. 7 illustrates a cross-sectional view of the LCD of the exemplary embodiment of FIG. 6, taken along line C-C' of FIG. 6.

Figure 7:
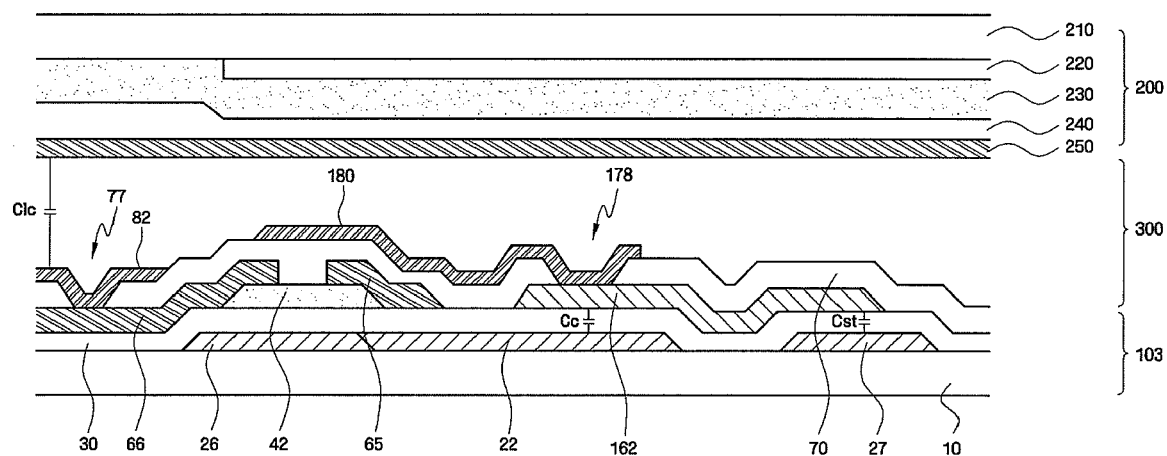
FIG. 7 illustrates a cross-sectional view of the LCD of the exemplary embodiment of FIG. 6, taken along line C-C' of FIG. 6.

Referring to FIGS. 6 and 7, a floating electrode 162 of the TFT display panel 103 may overlap not only a gate wiring (22 and 26) but also a storage wiring (27 and 28). The floating electrode 162 may overlap a storage line 27 and may thus generate a storage capacitance Cst. The floating electrode 162 may overlap the gate wiring (22 and 26) and may thus generate a coupling capacitance Cc. In addition, the floating electrode 162 may overlap the storage wiring (27 and 28) and may thus generate the storage capacitance Cst. The coupling capacitance Cc may be determined by the overlapping area of the floating electrode 162 and a gate line 22, and the storage capacitance Cst may be determined by the overlapping area of the floating electrode 162 and the storage line 27.

The storage capacitance Cst may hold an initial voltage charged by the coupling capacitance Cc. As a result, the voltage of an upper gate electrode 180 may be maintained at a positive level even when the voltage applied to a lower gate electrode 26 swings from a positive level to a negative level. For example, the storage capacitance Cst may prevent the voltage of the upper gate electrode 180 from dropping to a negative level even when the voltage applied to a lower gate electrode 26 swings from a positive level to a negative level, and may thus enable a positive direct current (DC) voltage to be applied to the upper gate electrode 180. Accordingly, the storage capacitance Cst may control the polarity of a voltage applied to the upper gate electrode 180.

The upper gate electrode 180 and the floating electrode 162 may be electrically connected to each other through a contact hole 178. Therefore, a voltage coupled to the floating electrode 162 by the coupling capacitance Cc and the storage capacitance Cst may be applied to the upper gate electrode 180.

An induced voltage Vtgate2 applied to the upper gate electrode 180 may be represented by Equation (2) as follows:

$$Vtgate2 = Vbgate * (Cc+Cst)/(Cc+Cst+Clc) \qquad (2)$$

where Vbgate indicates a voltage applied to the lower gate electrode 26 and Clc indicates a liquid crystal capacitance. Referring to Equation (2), the voltage Vtgate2 may be affected by the storage capacitance Cst.

The ratio of the liquid crystal capacitance Clc and the sum of the capacitances of the coupling capacitance Cc and the storage capacitance Cst may be within the range of about 0.1 to about 10 to minimize the shift of an initial source/drain current with respect to a gate voltage. An optimum induced voltage may be applied to the upper gate electrode 180 in response to a voltage applied to the lower gate electrode 26 when the ratio is in the above described range, thereby improving the negative bias stability of an LCD.

Figure 8:
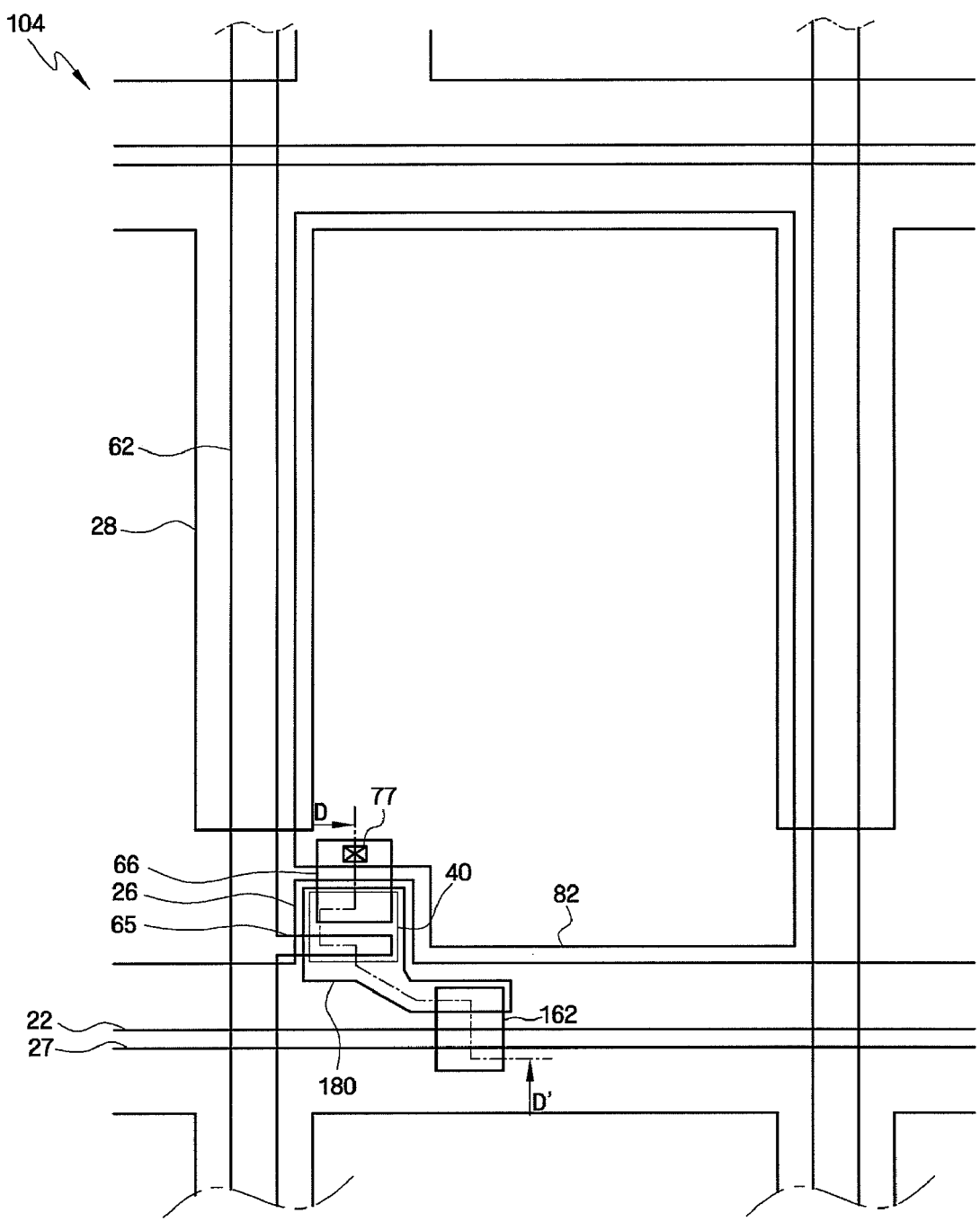
FIG. 8 illustrates a layout of a TFT display panel included in an LCD according to an exemplary embodiment of the present invention.
Figure 9:
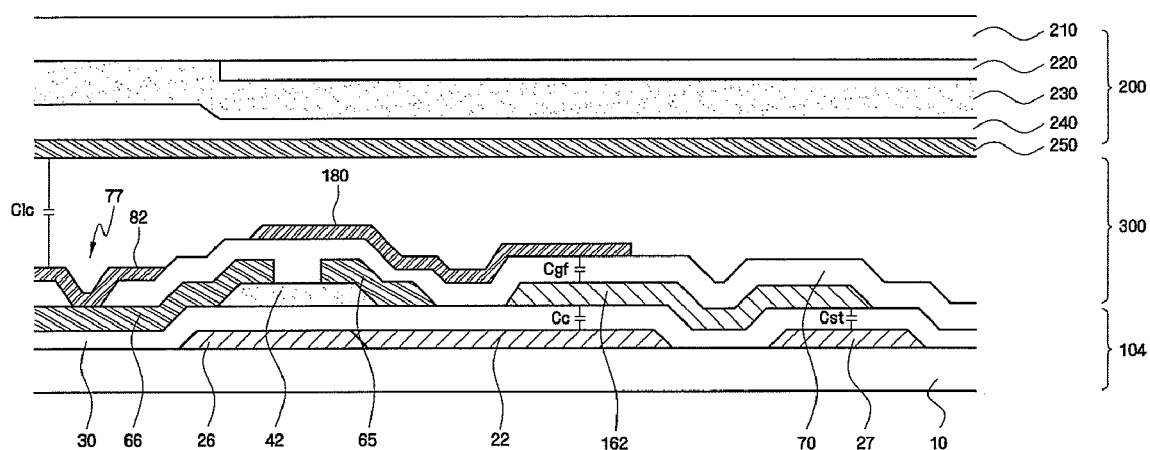
FIG. 9 illustrates a cross-sectional view of the LCD of the exemplary embodiment of FIG. 8, taken along line D-D' of FIG. 8.

An LCD according to another exemplary embodiment of the present invention will hereinafter be described in detail with reference to FIGS. 8 and 9. FIG. 8 illustrates a layout of a TFT display panel 104 included in an LCD according to another exemplary embodiment of the present invention, and FIG. 9 illustrates a cross-sectional view of the LCD of the exemplary embodiment of FIG. 8, taken along line D-D' of FIG. 8.

The exemplary embodiment of FIG. 8 is the same as the exemplary embodiment of FIG. 6 except that an upper gate electrode 180 and a floating electrode 162 of the TFT display panel 104 are isolated from each other by a passivation layer 70. The upper gate electrode 180 may generate an upper gate coupling capacitance Cgf together with the floating electrode 162.

For example, in the exemplary embodiment of FIG. 8, the coupling capacitance Cc and the upper gate coupling capacitance Cgf may both be used to apply different voltages to a lower gate electrode 26 and the upper gate electrode 180. The voltage applied to the upper gate electrode 180 may be maintained by a storage capacitance Cst.

While the present invention has been particularly shown and described with reference to exemplary embodiments thereof, it will be understood by those of ordinary skill in the art that various changes in form and details may be made therein without departing from the spirit and scope of the present disclosure.

What is claimed is:

1. A liquid crystal display (LCD) comprising:
   a gate wiring including a gate line formed on a first insulating substrate and a lower gate electrode protruding from the gate line;
   an oxide active layer pattern formed on the gate wiring;
   a data wiring including a data line intersecting the gate line;
   a floating electrode generating a coupling capacitance by overlapping the gate wiring; and
   an upper gate electrode capacitively coupled to the lower gate electrode.

2. The LCD of claim 1, further comprising a passivation layer between the upper gate electrode and the floating electrode, wherein the upper gate electrode and the floating electrode are electrically connected to each other through a contact hole formed through the passivation layer.

3. The LCD of claim 1, further comprising:
   a pixel electrode formed on the first insulating substrate;
   a second insulating substrate isolated from the first insulating substrate and facing the first insulating substrate;
   a common electrode formed on the second insulating substrate; and
   a liquid crystal layer interposed between the first insulating substrate and the second insulating substrate,
   wherein the pixel electrode, the common electrode and the liquid crystal layer generate a liquid crystal capacitance together.

4. The LCD of claim 3, wherein the ratio of the liquid crystal capacitance and the coupling capacitance ranges from about 0.1 to about 10.

5. The LCD of claim 3, wherein a voltage applied to the upper gate electrode satisfies the following equation:

$$Vtgate1 = Vbgate*(Cc)/(Cc+Clc)$$

where Vtgate1 indicates the voltage applied to the upper gate electrode, Vbgate indicates a voltage applied to the lower gate electrode, Cc indicates the coupling capacitance, and Clc indicates the liquid crystal capacitance.

6. The LCD of claim 1, wherein:
   the floating electrode overlaps the gate line; and
   the coupling capacitance is determined by an overlapping area of the floating electrode and the gate line.

7. The LCD of claim 1, wherein the floating electrode is formed of the same material as that of the data line and is disposed at substantially a same level with the data line.

8. The LCD of claim 1, further comprising a passivation layer interposed between the upper gate electrode and the floating electrode, wherein the upper gate electrode and the floating electrode are isolated from each other and generate an upper gate coupling capacitance together.

9. An LCD comprising:
   a gate wiring including a gate line formed on a first insulating substrate and a lower gate electrode extending from the gate line;
   a storage wiring including a storage line extending substantially in parallel with the gate line;
   an oxide active layer pattern formed on the gate wiring;
   a data wiring including a data line intersecting the gate line;
   a floating electrode generating a coupling capacitance by overlapping the gate wiring, the floating electrode generating a storage capacitance by overlapping the storage line; and
   an upper gate electrode capacitively coupled to the lower gate electrode.

10. The LCD of claim 9, wherein the storage capacitance holds an initial voltage charged by the coupling capacitance.

11. The LCD of claim 9, further comprising a passivation layer between the upper gate electrode and the floating electrode, wherein the upper gate electrode and the floating electrode are electrically connected to each other through a contact hole formed through the passivation layer.

12. The LCD of claim 9, further comprising:
   a pixel electrode formed on the first insulating substrate;
   a second insulating substrate isolated from the first insulating substrate and facing the first insulating substrate;
   a common electrode formed on the second insulating substrate; and
   a liquid crystal layer interposed between the first insulating substrate and the second insulating substrate,
   wherein the pixel electrode, the common electrode and the liquid crystal layer generate a liquid crystal capacitance together.

13. The LCD of claim 12, wherein the ratio of the liquid crystal capacitance and the sum of the capacitances of the coupling capacitance and the storage capacitance ranges between about 0.1 to about 10.

14. The LCD of claim 12, wherein a voltage applied to the upper gate electrode satisfies the following equation:

$$Vtgate2 = Vbgate*(Cc+Cst)/(Cc+Cst+Clc)$$

where Vtgate2 indicates the voltage applied to the upper gate electrode, Vbgate indicates a voltage applied to the lower gate electrode, Cc indicates the coupling capacitance, Cst indicates the storage capacitance, and Clc indicates the liquid crystal capacitance.

15. The LCD of claim 9, wherein:
the floating electrode overlaps the gate line and the storage line;
the coupling capacitance is determined by an overlapping area of the floating electrode and the gate line; and
the storage capacitance is determined by an overlapping area of the floating electrode and the storage line.

16. The LCD of claim 9, wherein the floating electrode is formed of the same material as that of the data line and is disposed at substantially a same level with the data line.

17. The LCD of claim 9, further comprising a passivation layer interposed between the upper gate electrode and the floating electrode, wherein the upper gate electrode and the floating electrode are isolated from each other and generate an upper gate coupling capacitance together.

* * * * *